US005781124A

United States Patent [19]

Chouteau

[11] Patent Number: 5,781,124
[45] Date of Patent: Jul. 14, 1998

[54] ELECTRICALLY CONFIGURABLE CONNECTION MATRIX BETWEEN LINES OF AT LEAST ONE INPUT/OUTPUT PORT FOR ELECTRICAL SIGNALS

[75] Inventor: Philippe Chouteau, Rennes, France

[73] Assignee: Transpac, Paris, France

[21] Appl. No.: 424,779

[22] Filed: Apr. 18, 1995

[30] Foreign Application Priority Data

Apr. 18, 1994 [FR] France ................................. 94 04598

[51] Int. Cl.$^6$ ........................................................ H04Q 1/18
[52] U.S. Cl. ................................. 340/825.87; 340/825.84
[58] Field of Search .......................... 340/825.87, 825.79,
340/825.83, 825.84, 825.94, 825.91; 326/38,
39, 41; 95/312, 827; 327/525; 257/50, 209,
529, 530

[56] References Cited

U.S. PATENT DOCUMENTS

| | | | |
|---|---|---|---|
| 3,191,151 | 6/1965 | Price | 340/825.84 |
| 3,423,646 | 1/1969 | Cubert et al. | |
| 3,656,115 | 4/1972 | Foerster | 340/825.84 |
| 4,004,261 | 1/1977 | Klingenberg | |
| 4,654,842 | 3/1987 | Coraluppi et al. | 340/825.8 |
| 4,742,348 | 5/1988 | Wagner | 340/825.91 X |
| 4,779,065 | 10/1988 | Katz et al. | 340/825.83 X |
| 5,282,271 | 1/1994 | Hsieh | 395/872 |
| 5,387,823 | 2/1995 | Ashizawa | 327/525 |
| 5,537,108 | 7/1996 | Nathan et al. | 340/825.84 |
| 5,559,971 | 9/1996 | Hsieh et al. | 395/312 |

FOREIGN PATENT DOCUMENTS

| | | |
|---|---|---|
| 0339534 | 4/1989 | European Pat. Off. |
| 2903000 | 1/1979 | Germany |

OTHER PUBLICATIONS

IEEE International Solid State Circuits Conference, vol. 28, Feb. 15, 1985, New York, pp. 268–269, H. Stopper "A Wafter With Electrically Programmable Interconnections". Electro '87 & Mini/Micro Northeast, Paper 36/1, vol. 12, 1987, Los Angeles, pp. 1–7, R., Johnson, "Silicon Interconnect Technology".

Primary Examiner—Edwin C. Holloway, III
Attorney, Agent, or Firm—Larson & Taylor

[57] ABSTRACT

An electrically configurable connection matrix provides connection of computing and/or telecommunication systems. The matrix comprises a dielectric support on which first and second networks of N electrical lines are formed. The electrical lines of the first network are connected to the pins of at least one input/output port. Each electrical line of rank k of the first network is connected by a permanent electrical connection to the electrical line of like rank k of the second network. Each electrical line of rank $q \ne k$ of the first network is electrically connected by a configurable electrical connection in the on or off state to the line of rank k of the second network. The switching on or off of a plurality of the configurable electrical connections provides an electrical link between two adjacent or non-adjacent electrical lines of the first network.

17 Claims, 8 Drawing Sheets

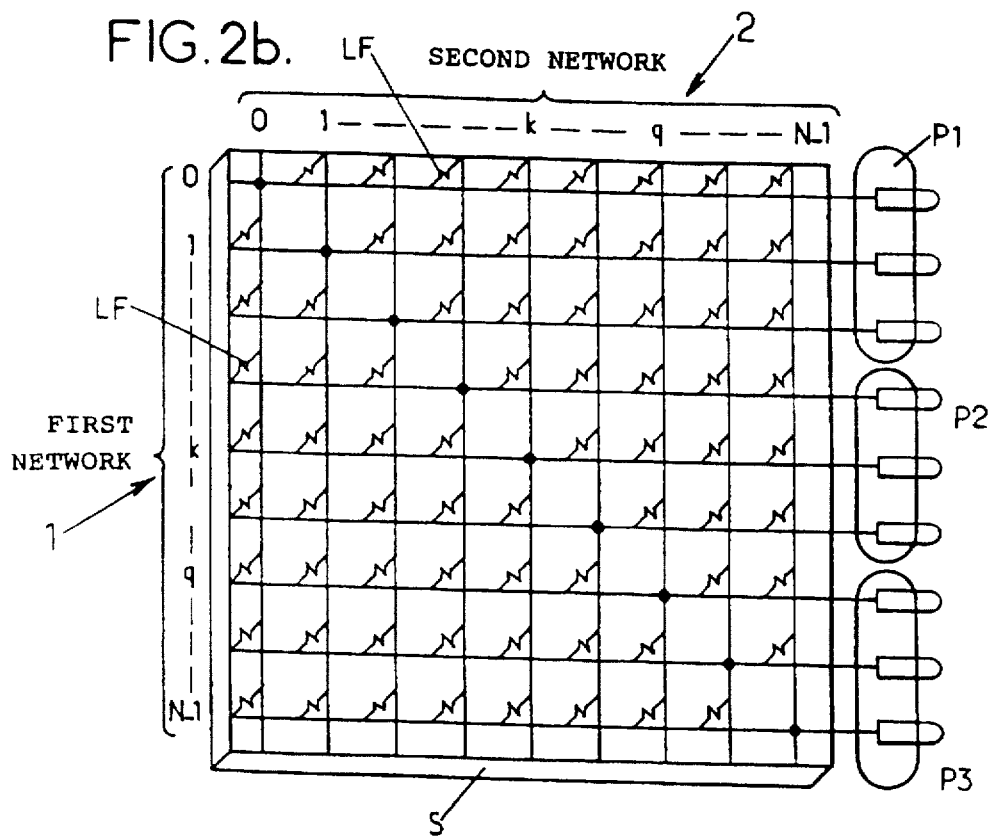
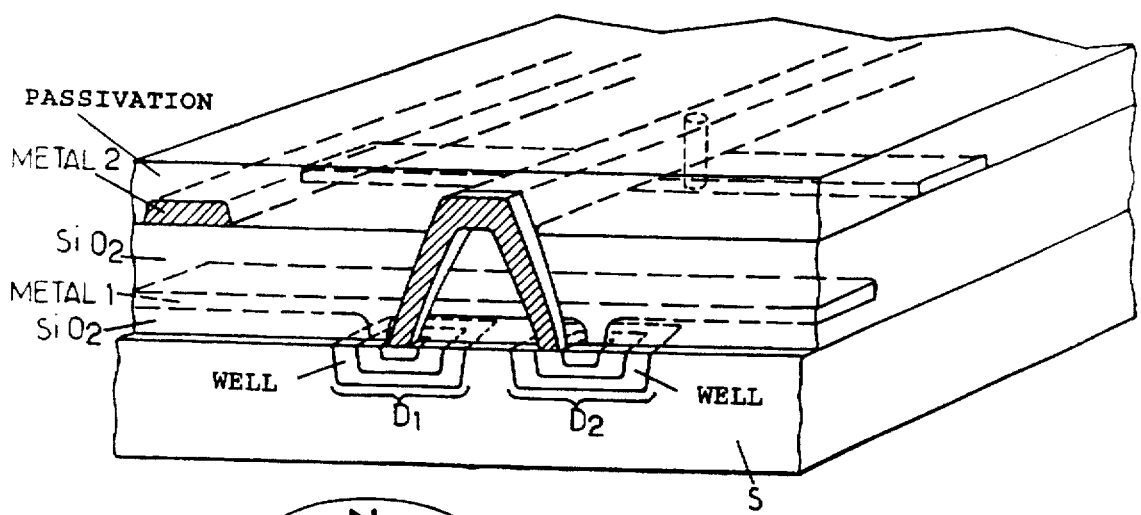
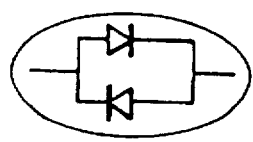

FIG.3b1.

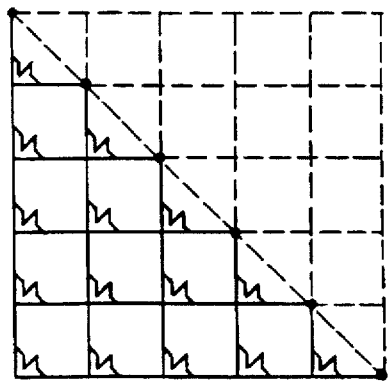
FIG.6a.
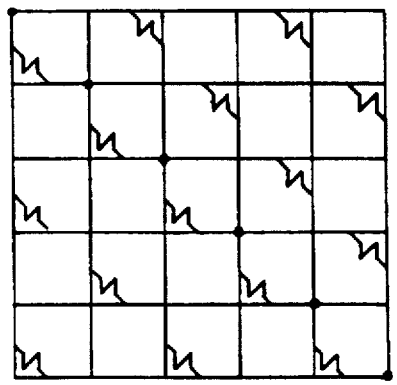
FIG.6b.
FIG.6c.
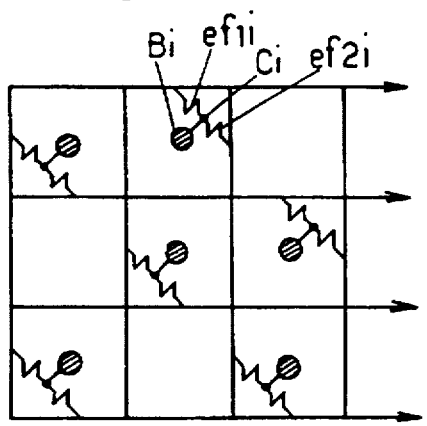
FIG.6d.
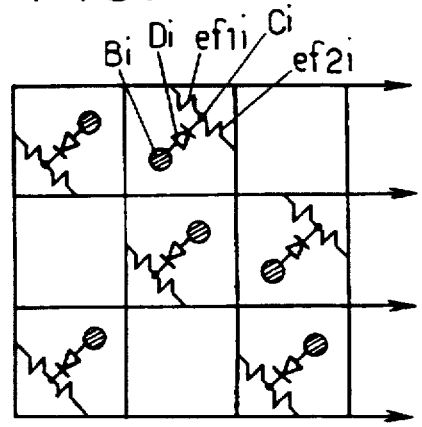

19
ELECTRICALLY CONFIGURABLE CONNECTION MATRIX BETWEEN LINES OF AT LEAST ONE INPUT/OUTPUT PORT FOR ELECTRICAL SIGNALS

FIELD OF THE INVENTION

The invention relates to an electrically configurable connection matrix between lines of at least one input/output port with N connection pins.

BACKGROUND OF THE INVENTION

In the technical field of data transmission, the interconnection of heterogeneous items of equipment is, among other things, carried out by means of cables which provide for the transmission of digital signals.

By reason of the great diversity of such items of equipment, although the interface circuits for interconnection between them are standardized, it is very often necessary to effect loopings and signal crossovers in order to implement these links.

The specific nature of each interconnection between two items of equipment therefore entails the use of a large number of cables, management of which is complex.

Currently, various types of electrically configurable connection matrices have been employed, essentially in the field of integrated circuits.

Among the latter, the IEEE document International Solid State Circuits Conference, Vol.28, 15 Feb. 1985, New-York, pp.268–269 published by H.STOPPER "A wafer with electrically programmable interconnectors" describes such a device, made in the form of an integrated circuit. This device, apart from the need for four levels of metallization, has the following major drawbacks. Owing to the employing of programmable connections in the initial open state, their switching to the conductive state renders the various electrical lines ever more dependent on a programming voltage pulse control. It is consequently necessary to provide specific lines, such that a single programmable connection per power line is switched.

Such a device is therefore very complex and allows, at the most, configuration by specific addressing.

Another type of programmable matrix has been described by the Patent Application EP 0 339 534, in the form of an integrated circuit structure in which numerous fusible points are introduced, so as to allow the establishment by specific addressing of various data configurations. In particular, the basic pattern of this structure comprises in a North-South direction pairs of electrical lines, the electrical lines in the East-West direction being configurable through a fuse situated between these pairs of lines, an East-West line being linked by a fuse to the two lines of each pair of North-South lines. This very complex structure is especially used to obtain very diversified semiconductor device networks.

SUMMARY OF THE INVENTION

The purpose of the present invention is to alleviate the aforesaid drawbacks by employing an electrically configurable connection matrix between lines of at least one input/output port with N connection pins so as in particular, starting from a type of interconnection of given structure, to limit the number of cables required to produce a given configuration, this configuration then being achievable no longer through the choice of specific interconnection cables, but rather, at the level of each connection matrix.

The electrically configurable connection matrix between lines of at least one input/output port with N pins, which is the subject of the present invention, is notable in that it comprises a dielectric support on which a plurality of N distinct electrical lines, forming a first network, are provided, each electrical line of this network being connected to a pin of the input/output port. A plurality of N distinct electrical lines forming a second network, distinct from the first, is provided, each electrical line of rank k of the first network, such that $k \in [0, N-1]$, being electrically connected by a permanent electrical connection to the electrical line of like rank k belonging to the second network.

Each electrical line of rank $q \neq k$ belonging to the first network is electrically connected by a configurable electrical connection in the on or off state to the electrical line of rank k belonging to the second network.

This makes it possible, through control of maintenance of the on state or of passage to the off state of a plurality of the configurable electrical connections, to provide for the electrical link between two adjacent or non-adjacent electrical lines of the first network.

The electrically configurable connection matrix between lines of at least one input/output port for electrical signals finds its application in computing and in telecommunications in order to produce configurations of installations for processing and/or for transmission of digital data.

BRIEF DESCRIPTION OF THE DRAWINGS

A more detailed description of a connection matrix according to the subject of the present invention will be given below, with reference to the drawings in which:

FIG. 2b represents a general view of another variant embodiment of the connection matrix which is the subject of the present invention, in which a partition of the electrical lines into groups of electrical lines is carried out, each group of electrical lines being linked to a distinct input/output port, FIG. 3e represents another particular embodiment of a connection matrix which is the subject of the present invention, also able to be used in the case of the embodiment of FIG. 1, 2a or 2b, FIGS. 6a and 6b represent a variant embodiment of the electrically configurable connection matrix, which is the subject of the present invention, in which the number of electrically configurable connections is optimized.

FIGS. 6c and 6d represent a variant embodiment of FIGS. 6a and 6b in the more specific case in which the configurable connection matrix is embodied in integrated circuit form.

DETAILED DESCRIPTION OF THE PREFERRED EMBODIMENTS

Figure 1:
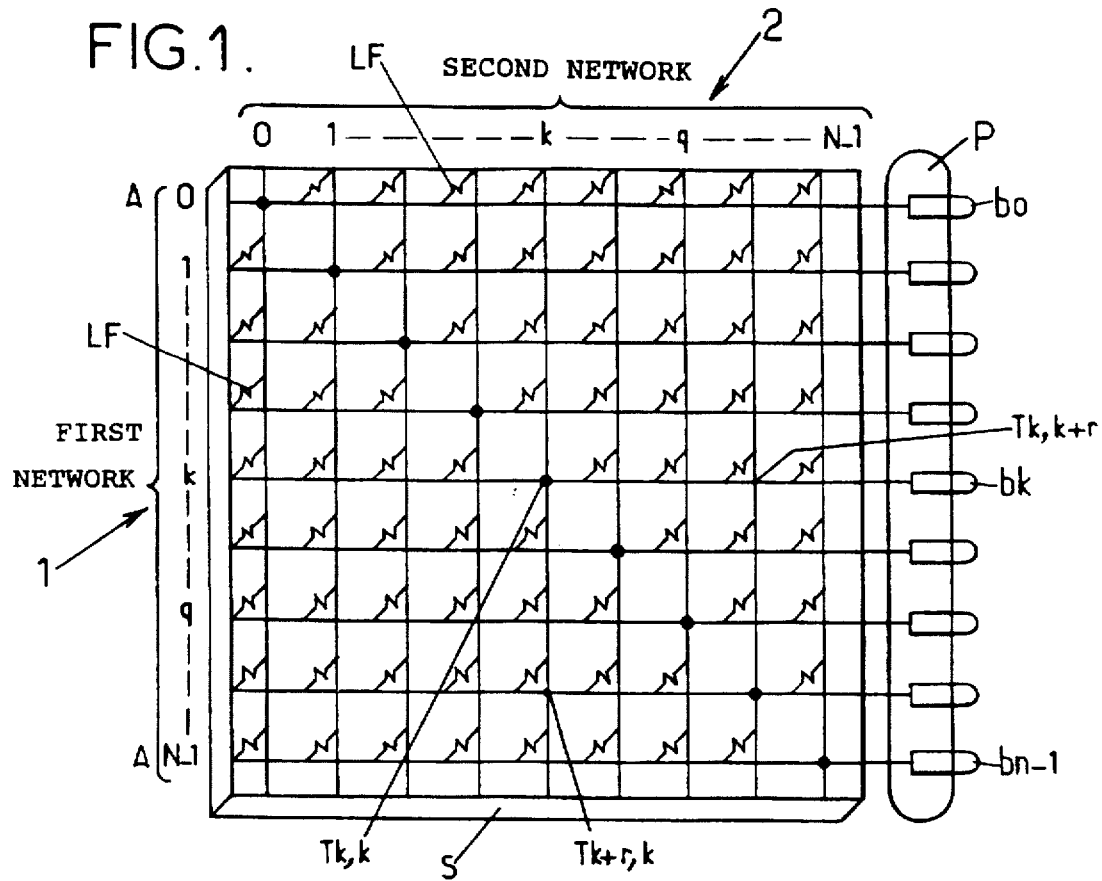
FIG. 1 represents a general view of an electrically configurable connection matrix between lines of at least one input/output port for electrical signals, according to the subject of the present invention.

A more detailed description of an electrically configurable connection matrix between lines of at least one input/output port according to the subject of the present invention will now be described in connection with FIG. 1.

In the aforesaid Figure, it is indicated that the connection matrix according to the invention comprises a dielectric support S and, on this support, a plurality of N distinct electrical lines forming a first network, denoted 1, of electrical lines.

Each electrical line of this first network is connected to a pin of an input/output port, denoted P, each pin being denoted $b_0$ to $b_{N-1}$.

According to another particularly advantageous aspect of the connection matrix which is the subject of the present invention, the latter comprises a plurality of N distinct electrical lines forming a second network, denoted 2, distinct from the first network 1. Each electrical line of rank k, the rank k lying between $|0, N-1|$ belonging to the first network is electrically connected by a permanent electrical connection, represented by a point, to the electrical line of like rank k belonging to the second network 2.

Each electrical line of rank $q \neq k$ of the first network 1 is electrically connected by a configurable electrical connection in the on or off electrical state to the electrical line of rank k belonging to the second network 2. In FIG. 1 it is indicated that each configurable electrical connection is represented by a broken line symbolizing a fusible link as will be described subsequently in the description.

It is understood that the structure of the connection matrix which is the subject of the present invention thus makes it possible, through control of maintenance of the on state or of passage to the off state of a plurality of the configurable electrical connections, to provide for the electrical link between two adjacent or non-adjacent electrical lines of the first network 1.

Generally, it is indicated that the electrical lines of the first respectively of the second network 1, 2 are substantially parallel to one another. The electrical lines of the first network are oriented in a first direction and the electrical lines of the second network are oriented in a second direction, transverse to the first. Preferably, the aforesaid directions are perpendicular and each line of the first and of the second network 1, 2 is labeled by its rank, denoted k,k+r even or odd, with $k \in |0, N-1|$, the value of $r \neq 0 \in |1-N, N-1|$.

According to a particularly advantageous aspect of the connection matrix which is the subject of the present invention, it is indicated that the electrical connection between two adjacent or non-adjacent lines of rank k and k+r of the first network is obtained when the logic relation:

Ak.Ak+r IF Tk,k AND Tk+r,k OR Tk,k+r AND Tk+r,k+r is satisfied.

In the aforesaid logic relation, it is indicated that the product Ak.Ak+r denotes the true logic value of interconnection of the lines A of rank k respectively k+r of the first network 1 and the first respectively the second index denotes the rank of the lines of the first respectively of the second network. The symbols IF, OR, AND denote the corresponding logical operators, condition, union, intersection.

Tk,k and Tk+r,k+r denotes the true logic value of the permanent electrical connection with address k,k respectively k+r,k+r between electrical lines of like rank of the first and of the second network.

Tk,k+r and Tk+r,k denotes the true logic value of the on state of the configurable electrical connections with corresponding addresses k,k+r and k+r,k between electrical lines of the first respectively of the second network, all the other configurable electrical connections connected to the interconnected electrical lines of rank k,k+r of the first network being at the complemented logic value of the off state for an interconnection of the only lines of rank k,k+r of the first network.

As regards the practical embodying of the interconnection matrix which is the subject of the present invention, it is indicated that the latter can be embodied on a printed circuit of small size, for example.

In a general way, it is indicated that all the lines of the connection matrix of the first network can be linked to a pin of the input/output port P.

The connection matrix according to the invention can then advantageously be enclosed in a package of metallic type, the whole being shielded and sealed against emitted and/or received electromagnetic disturbances.

Figure 2A:
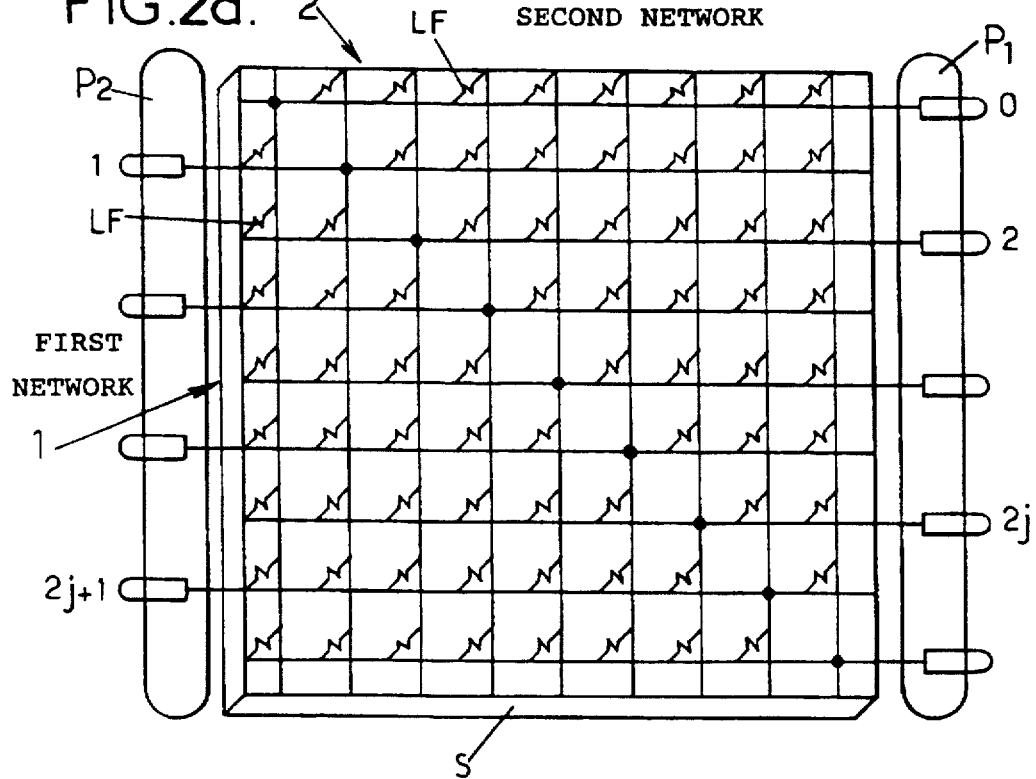
FIG. 2a represents a general view of a variant embodiment of the connection matrix which is the subject of the present invention represented in FIG. 1.

In a first advantageous embodiment such as represented in FIG. 2a, it is indicated that the electrical lines are formed by substantially rectilinear striplines or microstrips. The electrical lines of even rank k=2j of the first network 1 are linked at one of their ends to a first input/output port, denoted P1, and the electrical lines of odd rank k=2j+1 of the same first network 1 are linked at the other of their ends to a second input/output port, denoted P2. The connection pins of each input/output port P1 and P2 are denoted $b_0$ to $b_{2j}$, $b_1$ to $b_{2j+1}$ respectively.

In a second embodiment, such as represented in FIG. 2b, the striplines or microstrips are subdivided into groups of interconnected or non-interconnected electrical lines according to a specific configuration of each group. The electrical lines of each group are interconnected to a distinct input/output port, denoted $P_1$ to $P_3$ in the aforesaid Figure. It is thus understood that the connection matrix which is the subject of the present invention makes it possible to produce a partition of a bundle of electrical lines so as to produce, for example, a duplication of a BUS type line.

Generally, it is indicated that the aforesaid striplines or microstrips are formed on a dielectric support of the printed circuit board, ceramic substrate or silicon type.

Figure 3A:
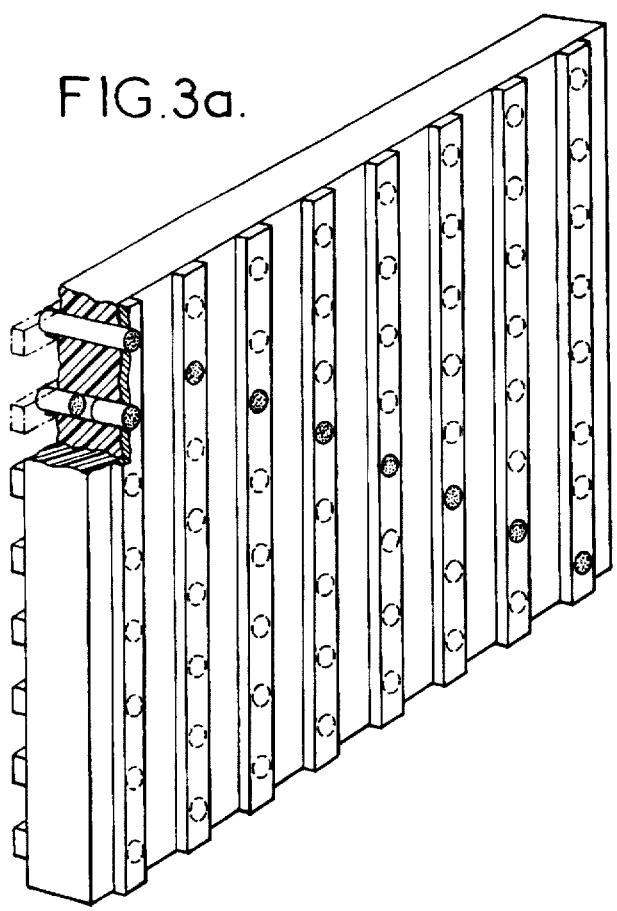
FIG. 3a represents a particular embodiment of a connection matrix which is the subject of the present invention capable of being used in the case of the embodiment of FIG. 1, 2a or 2b.
Figure 3A:
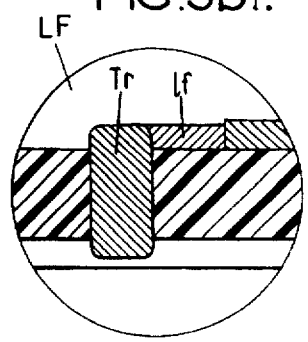

When the dielectric support is a support of printed circuit board type, this circuit can advantageously consist of a double-faced printed circuit. Such a circuit is represented in FIG. 3a.

The horizontal electrical lines then consist of tracks of width such that they are able to support a current equal to Imax>Ip>In under steady and pulsed conditions where In denotes a nominal value of current strength, Ip denoting the current required to carry out the programming. The aforesaid electrical lines are situated for example on the solder side of the printed circuit.

The vertical lines consist of tracks of the same width as the horizontal lines, these being situated on the component side of the printed circuit for example.

The permanent connections between a horizontal track and a vertical track of a same port are made by way of a through-hole which is furnished with a permanent metallization.

Figure 3B:
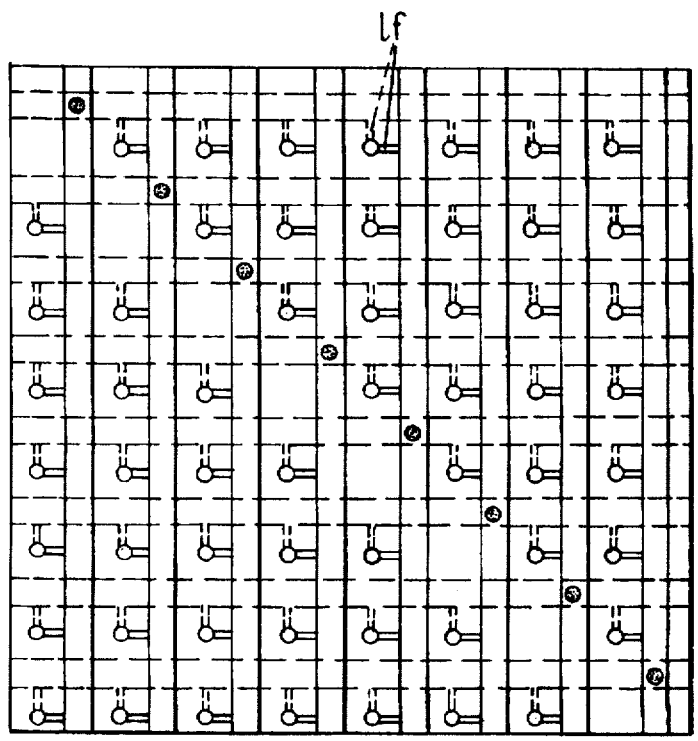
FIG. 3b represents a detail of the embodiment of FIG. 3a in a particular variant.

The configurable links, denoted LF, can then be made via conductive trails, denoted lf, the changes of face being effected by way of a metallized hole Tr for example, as represented according to an advantageous embodiment in FIG. 3b, the whole constituting the configurable link LF.

Figure 3C:
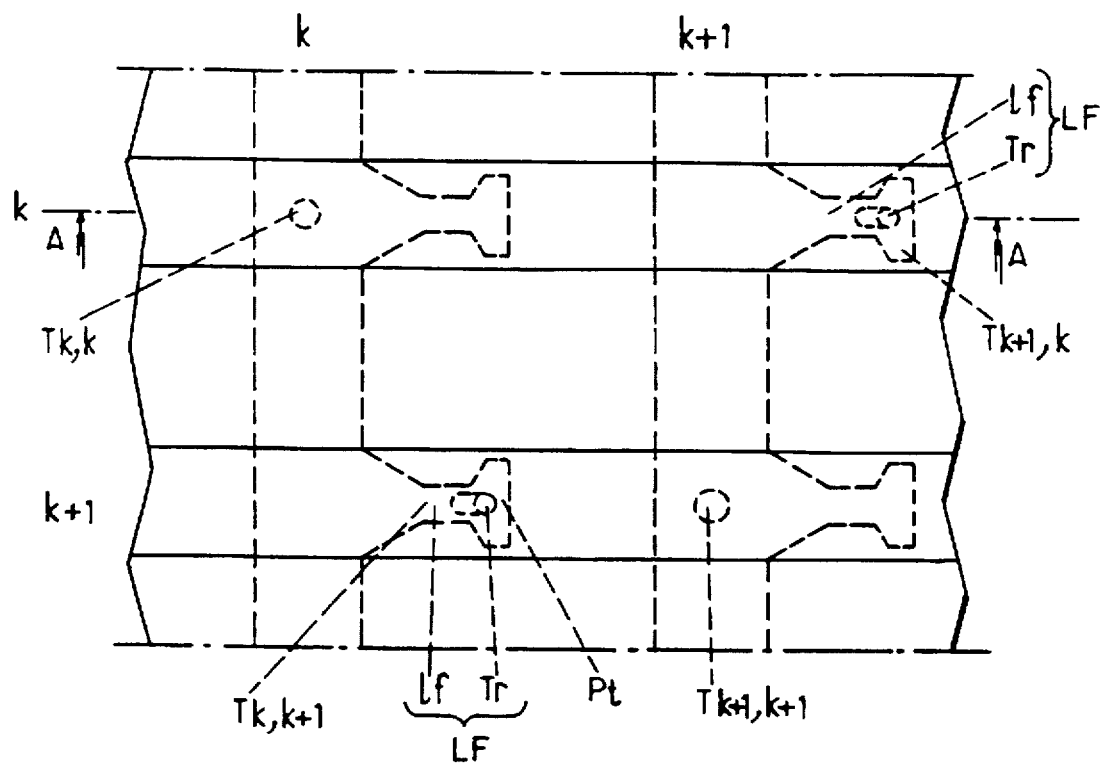
FIG. 3c represents a plan view of a particular embodiment of FIG. 3a, in the case where the connection matrix, which is the subject of the invention, is embodied in integrated circuit form, the passivation layer being deleted so as to bare a higher level of metallization.
Figure 3D:
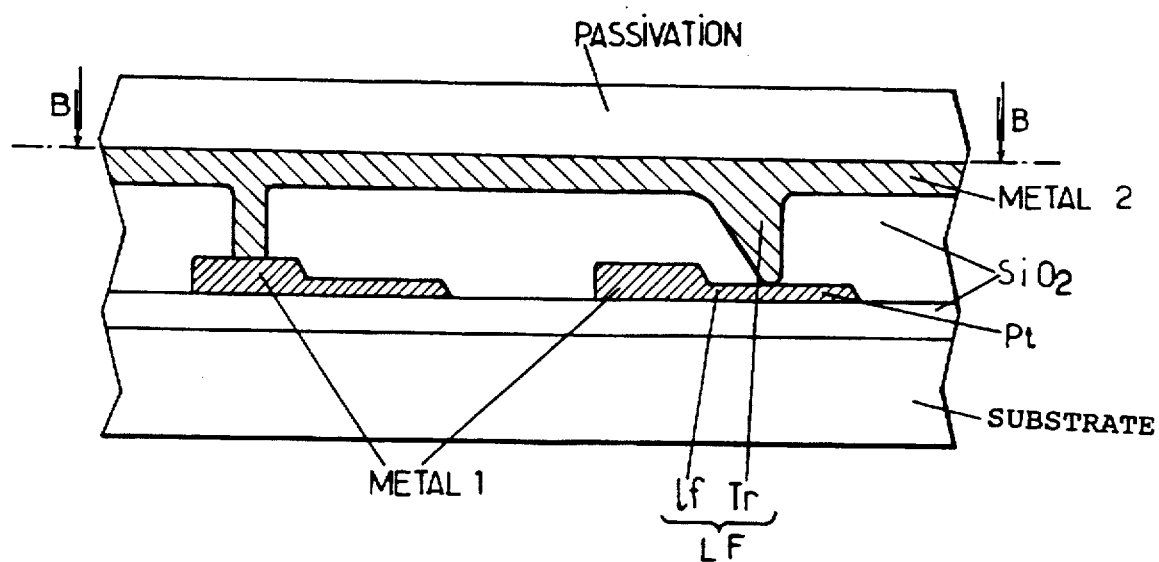
FIG. 3d represents a sectional view along a sectional plane AA of FIG. 3c.

In a variant embodiment such as represented in FIG. 3c and 3d, the connection matrix, which is the subject of the invention, can be embodied in integrated circuit form. The dielectric support is replaced by a silicon substrate including a first level of metallization, referenced metal 1, and a second level of metallization, referenced metal 2, each of the levels of metallization constituting the first respectively the second network of N electrical lines. The permanent electrical connections Tk,k can be made via a metallized through-hole, providing electrical contact between first and second level of metallization and the configurable electrical connections Tk,k+r or fusible links LF can, in a manner similar to the embodiment of FIG. 3b, be effected via a metallized through-hole Tr making it possible to ensure electrical contact, for example, between the second level of metallization and an electrically conducting stud Pt linked to the electrical lines forming the second network via a fusible connection lf. Each stud Pt [lacuna] fusible connection lf and metallized through-hole Tr constitutes a fusible link LF.

The steps making it possible to embody the connection matrix such as represented in FIG. 3c and 3d can then consist, starting from an N or P type doped silicon substrate, of operations of conventional type.

Furthermore, when the dielectric support is a substrate of silicon type for example, as represented in FIG. 3e, the horizontal lines can use a metallization level denoted metal 1 and the vertical lines another metallization level denoted metal 2, for example. The configurable links, that is to say the fusible links LF, can then be effected either by sublevels of metallization of lesser thickness or by way of through-holes sized in such a way that they are destructible by currents of strength value Idest such that Imax>Idest>In where In represents a given nominal value of current, or, as represented in FIG. 3e, by means of two diodes D1, D2 connected head to tail in parallel.

The electrical lines of the first 1 and of the second network 2 are then formed on the same face of the support S, consisting of the silicon substrate. They are separated by a layer of electrically insulating material, such as silicon oxide $SiO_2$ for example. The whole is covered by a passivation layer made for example from a layer of silicon nitride in a conventional manner.

The silicon substrate can then be encapsulated in a plastic or ceramic package.

The number of lines of each of the ports is to be adapted to the relevant application.

By reason of the fact that the electrically configurable connection matrices which are the subject of the present invention require no supply line, all the lines can be used for attachment to the pins of the input/output ports. Consequently, it is possible to use packages with 16 (8×8), 24 (12×12), 32 (16×16) or 48 (24×24) pins.

Under such circumstances, in order to produce cables for transmitting data according to recommendation V24 of the CCITT, it is necessary to use a 48-pin interconnection matrix whereas for the production of cables according to recommendation V11 of the CCITT, it suffices to use a 32-pin interconnection matrix. It is indicated that since the width of the strips or microstrips used is relatively large, it is possible to employ somewhat unsophisticated technologies.

The connection matrix having been made according to the diagrams represented earlier, all the intersections between the electrical lines of the first 1 and of the second network 2 are joined up.

Configuration of each connection matrix then consists, by programming, in opening all the purposeless links so as to retain only the paths which are purposeful in establishing a given connection pattern.

As expressed earlier in the form of a logic relation, for each interconnection between two pins of different order of the same port or of different ports, there are two interconnections, one between the vertical of a given pin and the horizontal of the other port, the other between the vertical of the other port and the horizontal of the first.

Figure 4:
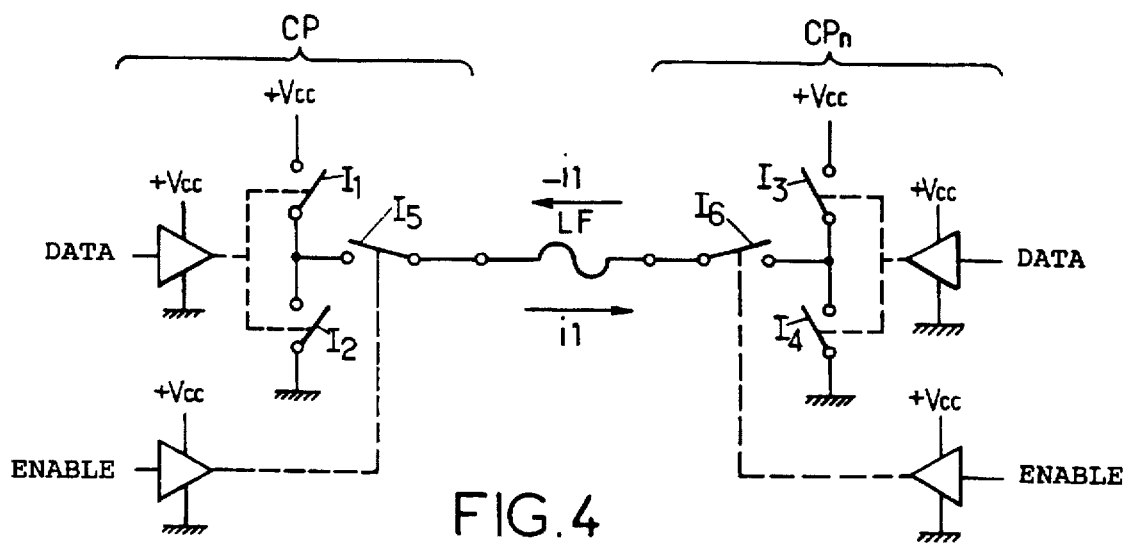
FIG. 4 represents a diagram illustrating an operating mode allowing programmable electrical configuration of a connection matrix which is the subject of the present invention.

For electrical lines of the first network of even rank 0 to 2j referenced B1 to Bn respectively of odd rank 1 to 2j+1 referenced A1 to An, configuration can consist in linking each pin to a circuit of the three-state power circuit type, this circuit being able to deliver/absorb a current of strength Iprog but limited to a value less than Imax, so as not to destroy the horizontal lines and the vertical lines. This circuit can for example, as represented in FIG. 4, possess a data input allowing the output to be set either to a voltage value +V or to the earth voltage, and an enable input allowing the output to be made active, that is to say at low impedance or at high impedance no current being delivered. It is understood, for example, that the operating of the interrupters $I_1$ to $I_6$ of the three-state power circuit allows the configurable link LF to be supplied with a current $i_1$ or $-i_1$ oppositely directed, $li_1l=I_F$, thus making it possible, when the fusible link is formed by two diodes mounted head to tail, to cause the breakdown of one and the other of these diodes in succession so as to provide for the configuring of the connection matrix.

The aforesaid command and data inputs are operated by a microcontroller for example across a bank of registers as will be described hereafter in the description.

In each horizontal line, that is to say in each electrical line of the first network, there may also be connected an input of a read register, which makes it possible to monitor the state of programming for verification operations.

Programming with a view to configuration consists in selecting a pair A1, A2, forming an equipotential pair for example, for which the electrical link by way of the configurable links is to be established.

The operations performed can then consist:

in setting all the power circuits to high impedance value, in setting all the power circuits to the value of the earth voltage, in transferring all the power circuits into the active state, in applying voltage pulses with the value +V to the data inputs of the pair to be isolated, in reading the state of the ports during the pulse states so as to determine the moment at which it is possible to pass to one or more groups of succeeding equipotential lines.

A verification step consists:
  in setting all the outputs of the power circuits to high impedance,
  in successively applying a voltage level +V to one of the power circuits rendered active,
  in monitoring the state of all the other inputs and in comparing them with the desired value,
  in passing to the next power circuit.

Figure 5:
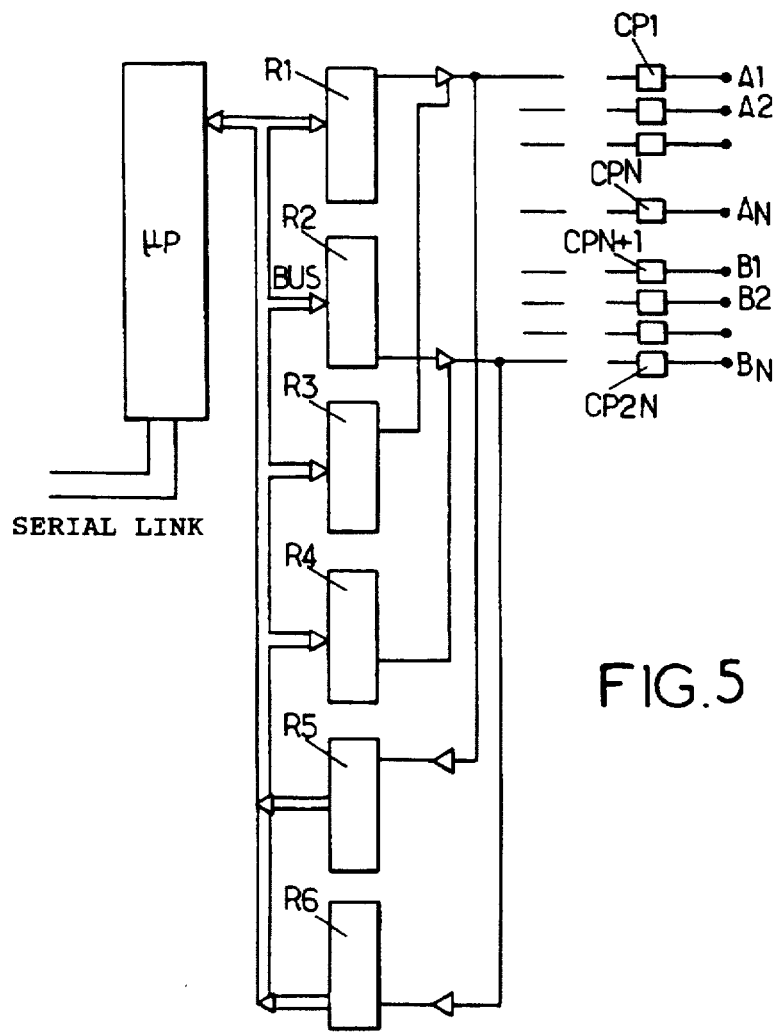
FIG. 5 represents, by way of example, a programmer more particularly adapted for carrying out the configuration of a connection matrix which is the subject of the present invention.

Represented in FIG. 5 is a diagram representing a specific programmer making it possible to carry out the configuration, on an industrial scale, of connection matrices in accordance with the subject of the invention. The programmer comprises a microprocessor µP connected through a BUS link to output-addressable registers $R_1$ to $R_4$ and input-addressable registers $R_5$ to $R_6$. The registers $R_1$ to $R_4$ are linked to three-state power circuits $CP_1$ to $CP_{2N}$, such as represented in FIG. 4c, and are controlled as mentioned earlier, the output of a three-state power circuit $CP_k$ being linked to a pin and hence to a line of the first 1 or of the second network 2. The banks of registers $R_1$ to $R_4$ make it possible to control the three-state power circuits in order to configure one or more successive connection matrices, and the registers $R_5$ to $R_6$ make it possible to monitor the state of the programming performed. The programmer can moreover be furnished with a serial link interface which can be connected up to the corresponding link interface of a microcomputer, or be embodied in the form of a slot-in card. Configuration and verification of the connection matrices can then be conducted in the same way as for a standard EPROM programmer.

The various embodiments described earlier in the description of the electrically configurable connection matrix, which is the subject of the present invention, actually make it possible to link up, from an input/output port, all the other input/output ports associated with each of the links of two electrically configurable connections.

Indeed, the connection matrix described earlier in fact associates an electrically configurable connection of each line of rank q together with a line of rank q+r, with r≠0, r belonging to [1–N, N–1].

A preferred embodiment of an electrically configurable connection matrix making it possible to effect the same interconnection logic combinations between input/output ports as the connection matrix described earlier but, however, making it possible to optimize, at a minimum number, the number of electrically configurable connections required to ensure all types of possible interconnections, will now be given in relation to FIGS. 6a, 6b and the succeeding Figures.

In accordance with the aforesaid Figures, it is indicated that for a first and a second network each comprising N distinct electrical lines, the number of electrically configurable electrical connections can be optimized and taken equal to $N_c=N(N-1)/2$.

Of course, this choice makes it possible to establish any link between two adjacent or non-adjacent electrical lines of the first network, as has been mentioned earlier.

Thus, as represented in particular in FIG. 6a, it is indicated that in a first variant embodiment, the first and the second network of distinct electrical lines are each limited by the set of permanent electrical connections of rank k, the first and the second network thus extending on one and the same side of the limit, represented in FIG. 6a by the dashed diagonal, formed by the set of permanent electrical connections.

In FIG. 6a is thus represented a triangular structure made on one and the same side of the diagonal of the permanent electrical connections. For a structure which is equivalent from the logic point of view containing in fact 6×6 lines of the first respectively of the second network, it is then sufficient to provide, apart from the permanent electrical connections symbolized by points, a plurality of $N_c=15$ electrically configurable connections, that is to say 15 fuses, for example.

Thus, as moreover represented in FIG. 6b in a second variant embodiment, the first and the second network of distinct electrical lines can however extend on either side of the limit formed by the set of permanent electrical connections, that is to say the limit formed by the diagonal of the permanent electrical connections in FIG. 6b. However, as represented in the aforesaid Figure, an electrical line of rank q≠k belonging to the first network is electrically connected by an electrically configurable electrical connection in the on or off state to the line of rank k belonging to the second network, if the electrical line of rank q≠k of the second network is not electrically connected by an electrically configurable electrical connection in the on or off state to the line of rank k belonging to the first network, and vice versa.

In the second variant embodiment such as represented in FIG. 6b, it is indicated that the structure thus produced is of antisymmetric type with respect to the diagonal of the permanent electrical connections, the antisymmetric character with respect to this diagonal, represented dashed in FIG. 6b, appearing owing to the fact that at every point of intersection of an electrical line of rank q of the first network and of an electrical line of rank q+r of the second network, for which point of intersection there is or is not an electrically configurable connection, corresponds a symmetrical point of intersection of the lines of rank q+r of the first network and of rank q of the second network, a symmetrical point with respect to the diagonal of the permanent connections, and for which, on the contrary, there is not, or there is, an electrically configurable connection, and vice versa.

This embodiment such as represented in FIG. 6b is particularly advantageous insofar as it allows optimization of the spacing for laying out the configurable electrical connections in the on or off state, that is to say in fact maximization of the distance separating two consecutive fuses, this distance, for a pitch p of the network, being brought to the value of the diagonal of the square of corresponding dimensions.

It is thus understood that the embodiment such as represented in FIG. 6b makes it possible to minimize locally the heating of the connection matrix during configuration of the latter by programming.

Such an embodiment will therefore be reservable for the manufacture of configurable connection matrices in the form of integrated circuits so as to avoid excessive heating.

Generally, in all the embodiments of the configurable connection matrix, which is the subject of the present invention such as described earlier in the description, the electrically configurable connections in the on or off state can be formed either by fuses, or by conductive inks, or else by diodes mounted head to tail under positive or negative logic.

The term positive or negative logic corresponds to the fact that under positive logic for example, all the points of intersection of the lines of the first respectively of the second network, other than those furnished with a permanent electrical connection, are furnished for example with a fusible electrical connection before any configuring. Contrariwise, the term negative logic corresponds to the case where the aforesaid intersections are devoid, before any configuring, of a fusible electrical link, configuring then being able to consist in introducing an electrical connection at specified points of intersection.

By way of non-limiting example, it is indicated that when, under positive logic, fusible elements such as copper filigree are used, it is necessary to provide relatively large fusing currents since the melting temperature of copper is 1083° C.

In the context of negative logic, on the other hand, the configurable connection matrices, which are the subject of the present invention, are designed with all the programmable links open when etching the printed circuit.

An additional operation then consists in introducing into the manufacturing process a step of depositing a fuse of a different kind from that of the electrical lines.

In order to employ tin-lead fuses during the production of printed circuits, a resist varnish can be deposited on the horizontal lines and vertical lines making up the lines of the first and of the second network. Then only the regions composed unitarily of an interrupted conductor are spared.

The connection matrix thus produced can then be passed through a tin-lead wave bath, according to the normal soldering techniques with controlled temperature and controlled speed.

As a consequence of the aforesaid operating mode, a solder link is produced which depends on the orientation of the spared regions, this link being produced between the two parts of the interrupted track thus forming a tin-lead fuse whose melting temperature does not exceed 300° C.

The temperature of the wave as well as the speed of advance of the circuit then make it possible to control the thickness of material deposited.

Other types of fusible materials can be used.

In particular, starting from the principle of negative logic with sparing of the conductive regions of each fuse, it is then possible to introduce into the manufacturing process a deposition by silk-screen printing of a conductive ink forming a fuse between each unitary end of a fusible region.

This conductive ink trail thus formed, the nature of which can be specifically adapted, ink with gold, with silver, with lead or with a specified alloy, then forms a fusible element whose resistance to melting can be controlled through the thickness of the deposition made.

The programming of such a connection matrix can then be carried out as described earlier in the description, for example.

As regards the various purposeful connections, the latter, being capable of making it possible to achieve one or the other of the configurable electrical connections, can be made on request according to a technique consisting in selectively depositing conductive imprints with a conductive ink base onto the links determined by the requirements of the final product.

Deposition of conductive ink can then be performed by virtue of an ink jet type spraying system in which the ink is spread through a nozzle of small size. Guidance of the ink flux can be effected, either by XY displacement, or by deviation in an electric field, according to known techniques.

A third variant embodiment of a connection matrix, which is the subject of the present invention, will now be described when this configurable connection matrix is embodied in integrated circuit form. These embodiments are given in connection with FIGS. 6c and 6d.

As represented in the aforesaid Figures, it is indicated that, in such a case, the electrically configurable electrical connections in the on or off state are formed by a first and a second fusible element, denoted $ef_{1i}$, $ef_{2i}$ in the aforesaid Figures, these fusible elements being interconnected in series between an electrical line of the first and of the second network.

Furthermore, a terminal for applying a signal for configuration by programming is provided, this terminal being electrically linked to the midpoint of interconnection of the first and of the second fusible element $ef_{1i}$, $ef_{2i}$.

It is of course understood that the link between the terminal for applying the configuration signal and the aforesaid midpoint can be made by virtue of the metallization techniques described earlier. The terminal $B_i$ for applying the configuration signal can itself be made via a metallization forming a specific stud.

As furthermore represented in FIG. 6d, the terminal $B_i$ can advantageously be linked to the midpoint by way of a diode.

When configuring the configurable connection matrix such as represented in FIG. 6c or 6d, the operating mode can then consist in linking the set of input/output ports referenced $A_1$, $A_2$, $A_3$, $A_4$ for example to a common potential, linked for example to one of the terminals of a voltage generator, and in applying the potential of the other terminal of this generator to the midpoint $C_i$ by way of the terminal $B_i$, for example.

In such a case, the current for fusing the fusible elements causes the rupture of one, $ef_{1i}$, and then the other, $ef_{2i}$, for example, and only of these elements.

The aforesaid solution can then be employed in particular for the programming of configurable connection matrices embodied in the form of integrated circuits.

A more detailed description of a process for programmed configuration of a configurable connection matrix, which is the subject of the present invention, such as described earlier in the description will now be given in connection with FIGS. 7a, 7b and 7c.

In a general way, it is indicated that the aforesaid process for programmed configuration can of course be employed either for an electrically configurable connection matrix in which the number of electrically configurable connections is not optimized, or, on the contrary, when this number is optimized.

In all cases, it is indicated that the programmable connection matrix subjected to the procedure for programmed configuration is regarded as constituting a matrix containing N×N electrical lines constituting the first and the second network.

Figure 7A:
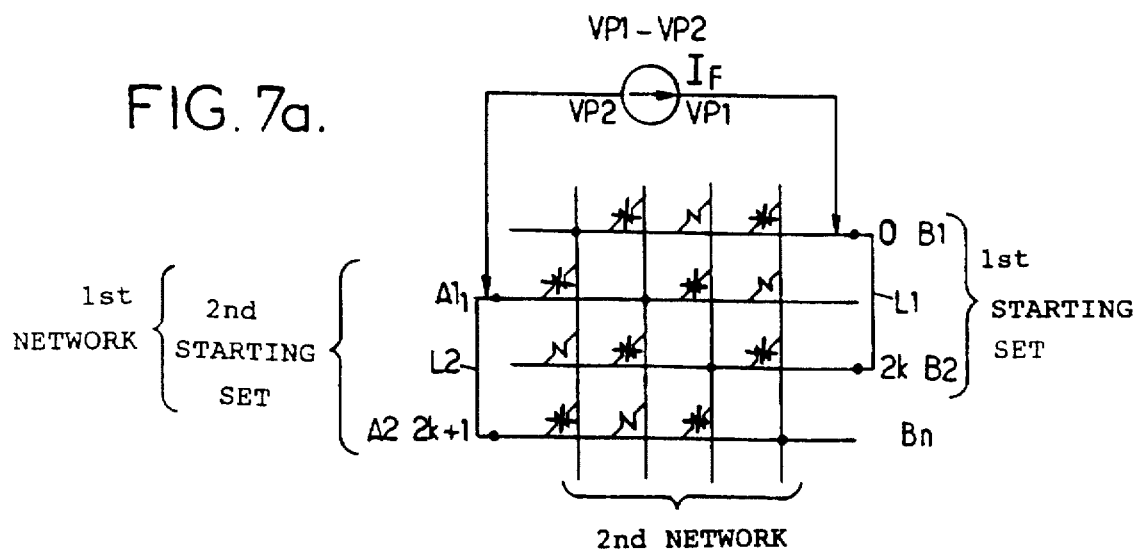
FIGS. 7a, 7b and 7c relate to a process for programmed configuration of an electrically configurable connection matrix by definition in one of the networks of equipotential sets and subsets.

As represented diagrammatically in FIG. 7a, the process for programmed configuration consists, in a step a, in applying to a first starting set containing Q electrical lines of the first network, a first electrical programming potential of specified value. In FIG. 7a, it is understood that the Q electrical lines of the first network are equal to two and bear the reference 0,2k even lines for the terminals $B_1$, $B_2$. The applied potential is assumed equal to $VP_1$, the lines 0 and 2k being interconnected by virtue of an electrical link $L_1$ applied at the level of the terminals $B_1$ and $B_2$.

The process for programmed configuration consists moreover, in a step b, in applying to a second starting set, containing P electrical lines of the same first network, a second electrical programming potential of specified value. In FIG. 7a, in a non-limiting manner solely by way of example, the second starting set contains P=2 electrical lines of the first network bearing the references 1, 2k+1 odd lines, these lines being linked to the terminals $A_1$ and $A_2$. The second electrical programming potential has the value $VP_2$ and is applied to the P lines, that is to say to the lines 1 and 2k+1 by way of an electrical link $L_2$ applied to the terminals $A_1$ and $A_2$.

Simultaneous application of the first and of the second electrical programming potential to the first, respectively the second starting set, makes it possible to maintain in the initial on state every configurable electrical connection with address k in the second network ensuring electrical connection between two electrical lines of the first starting set, and to place in the off state every configurable electrical connection with address k in the second network ensuring electrical connection between an electrical line of the first and of the second starting subset.

It is of course understood that, in order to provide for the aforesaid operations for maintaining in the initial on state or for setting to the off state, it suffices for the potential difference $VP_2-VP_1$ to be sufficient to develop the fusing current $I_F$ mentioned earlier in the description.

Figure 7B:
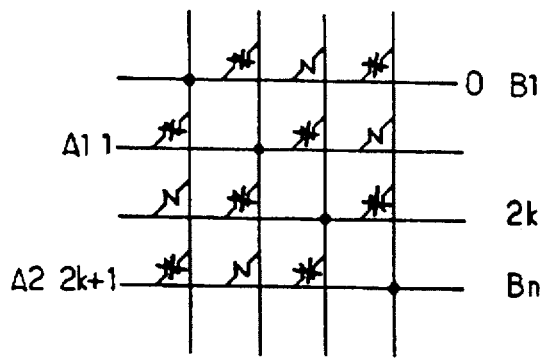

After carrying out the aforesaid steps a and b, corresponding configuration is obtained, as represented in FIG. 7b, in which the electrically configurable connections which have been placed in the off state have quite simply been deleted, whereas those alone which have been maintained in the initial on state are represented.

Following the aforesaid steps a, b, the process for programmed configuration of a configurable connection matrix which is the subject of the present invention next consists in repeating the operations a and b over successive subsets of the first and second starting sets in order to obtain a final configuration.

From the point of view of the operating mode of the process for programmed configuration described earlier in connection with FIG. 7a and FIG. 7b, it is indicated that the linking of the input/output ports of the first starting set, respectively of the second starting set, and moreover successively for every corresponding subset of these latter, has the effect of making the fusing current $I_F$ from the generator flow simultaneously through all the fuses or electrically configurable connections situated between these two sets, the first respectively the second starting set, and through these electrically configurable connections only.

The fusing current $I_F$ being assumed to be sufficient, the electrically configurable connections break one after the other and enable the relevant equipotential subset to be isolated.

Repetition of the programming procedure according to steps a and b in compliance with step c described earlier, for the first or the second starting set according to two corresponding subsets, makes it possible to obtain the final configuration according to a corresponding plurality of sets and subsets.

It is indicated that detection of the completion of programming can then be performed in a particularly advantageous way insofar as this detection can be performed automatically by measuring the current flowing between the two subsets. When the current becomes 0, the sets are insulated from one another.

A more detailed description of an optimized variant of the process for programmed configuration described earlier in the description with FIGS. 7a and 7b will now be given, in particular with FIG. 7c.

This optimized variant can of course be employed, . . . either for a number of non-optimized or optimized configurable electrical connections [sic]. In the latter case, the number of these configurable electrical connections is equal to $N_c=N(N-1)/2$.

In the aforesaid case, the number of configurable electrical connections contained in the first starting set is equal to $N_{CQ}=Q(Q-1)/2$ where Q of course denotes the number of lines of the first network constituting the first starting set.

In the same way, the number of configurable electrical connections contained in the second starting set is equal to $N_{CP}=P(P-1)/2$ where P denotes the number of electrically configurable connections contained in the second starting set.

The number of electrically configurable connections linking the first starting set to the second starting set is given by the relation:

$N_{CQP}=Q(N-Q)$ since $N=Q+P$.

It is therefore observed that this number of electrically configurable connections providing for the link between the electrical lines of the first and of the second starting set is an increasing function over the interval $Q \in |1,N/2|$ and then decreasing over the interval $Q \in |N/2,N|$.

Under these circumstances, the process for programmed configuration in its variant embodiment consists, in a step d, in choosing, as first starting set, the set of electrical lines of the first network containing the minimum number of electrical lines for a relevant application, the smallest minimum then being equal to one electrical line constituting the first starting set.

Under these circumstances, the aforesaid process then consists in choosing as second starting set, in a step e, the set complementary to the first starting set over the set formed by the totality of the electrical lines of the first network.

This operating mode makes it possible locally to optimize, at a minimum number, the number of electrically configurable connections subjected to the configuration operation.

Through repetition of such an operating mode, it is of course understood that it is possible to minimize the number of electrically configurable connections subjected to the configuration operation.

Figure 7C:
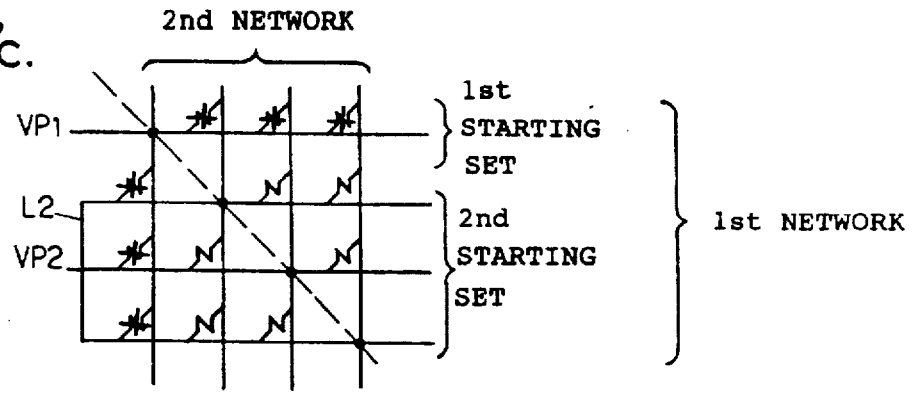

As represented in FIG. 7c, in the case where the first starting set of the set of electrical lines of the first network contains a single line, this line is brought to the potential $VP_1$, whereas all the lines of the second starting set of the first network are brought to the potential $VP_2$ by virtue of the electrical link $L_2$ represented in FIG. 7c.

For a connection matrix containing a number of electrically optimized configurable connections, that is to say for a matrix formed by a triangular matrix, consisting for example of the portion situated to the left of the diagonal of the permanent connections, the number of electrically configurable connections to be broken is equal to $N-1$, that is to say 3 in the non-limiting case of FIG. 7c.

The procedure can then be repeated on the second starting set in order to produce a specified configuration, and so on.

It is thus understood that the value of N on each occasion takes the value of the number of ports contained in the relevant remainder, N initially equal to 4 in the case of FIG. 7c becoming, after applying steps d and e described earlier, equal to 3 for the electrical lines making up the second starting set.

It is of course understood that, although described in relation to a relatively small number of lines and hence of input/output ports, the process which is the subject of the present invention is particularly advantageous since it allows optimization of the operations to be performed in respect of the programming by virtue of a configurable matrix, which is the subject of the present invention, of input/output systems containing up to 50 ports or more.

A more detailed description of a device making it possible to carry out the programmed configuration of a connection matrix in accordance for example with the programming process described earlier, will now be given in connection with FIGS. 8a and 8b.

Figure 8A:
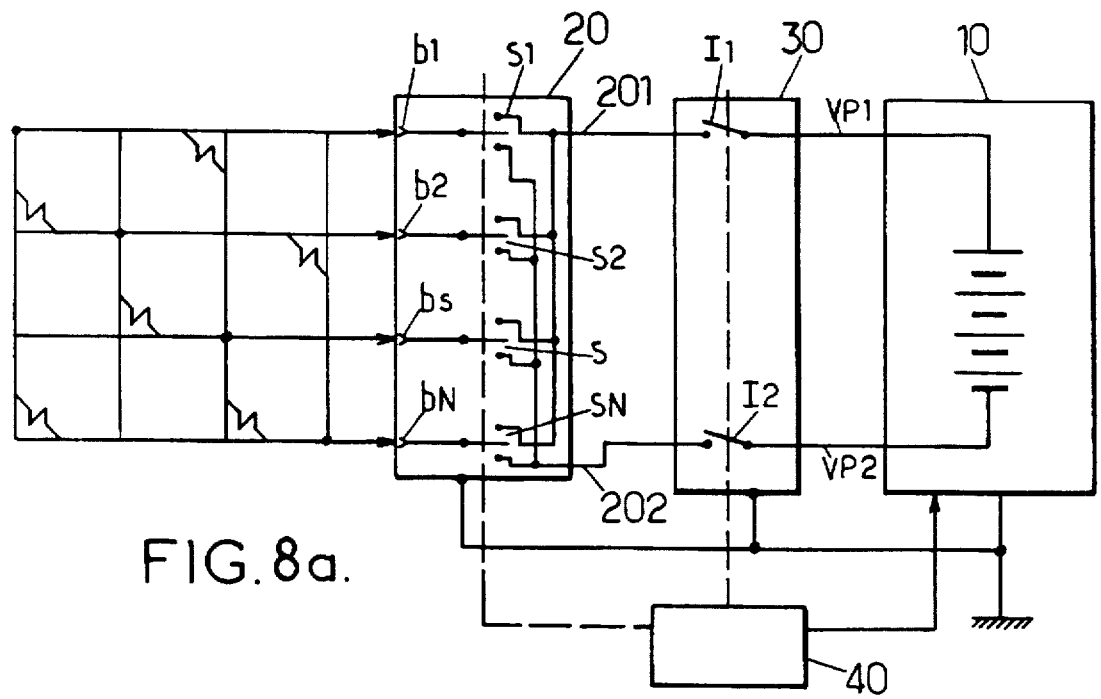
FIG. 8a represents a schematic diagram illustrating a device especially adapted for the implementation of the process of programmed configuration by the method of equipotential sets and subsets.

In general, in connection with FIG. 8a, it is indicated that the device according to the invention includes at least one circuit 10 generating at least two distinct programming voltages, this circuit 10 being able to consist for example of a stabilized power supply capable of delivering the aforesaid two programming potentials $VP_1$ and $VP_2$. This generator is symbolized by a battery, for example a storage battery, and preferably embodied via a stabilized supply.

Furthermore, the device as represented in FIG. 8a comprises a circuit for selective interconnection, denoted 20, of the electrical lines of the first network of the connection matrix according to a first and a second starting set. The circuit 20 can comprise for this purpose a series of two-position switches, denoted $S_1$, $S_2$ to $S_N$, whose switching terminals are linked to a first, respectively a second input, denoted 201, 202, and whose switched terminal is linked to an output terminal intended to receive a corresponding terminal of the configurable connection matrix which is the subject of the present invention. The terminals are denoted $b_1$ to $b_N$.

Furthermore, a circuit 30 for applying programming potentials $VP_1$ and $VP_2$ is provided, this circuit 30 being able to consist for example of two controlled interrupters $I_1$ and $I_2$ interconnected, on the one hand, to the terminals for output of the potentials $VP_1$ and $VP_2$ delivered by the generating circuit 10, and, on the other hand, to the input terminals 201, 202 of the circuit for selective interconnection 20.

Of course, the controlled interrupters $I_1$, $I_2$ and the switches $S_1$, $S_2$ are also operated by way of a control circuit 40, which can be a microprocessor circuit making it possible to operate, not only the turning on of the stabilized supply constituting the generating circuit 10, but also the controlled interrupters $I_1$ and $I_2$ and the switches $S_1$ to $S_N$.

Of course, the control circuit 40 can be furnished with a program making it possible to carry out the implementation of the process in accordance with the process described earlier in the description, that is to say by subdividing, by configuring the switches $S_1$ to $S_N$, the relevant connection matrix into a first and a second starting set, then by applying by way of the controlled interrupters $I_1$ and $I_2$ the configuration potentials $VP_1$ and $VP_2$, and, by next modifying the configuration of the switches $S_1$ to $S_N$, repeating the programming procedure for the succeeding subsets.

Figure 8B:
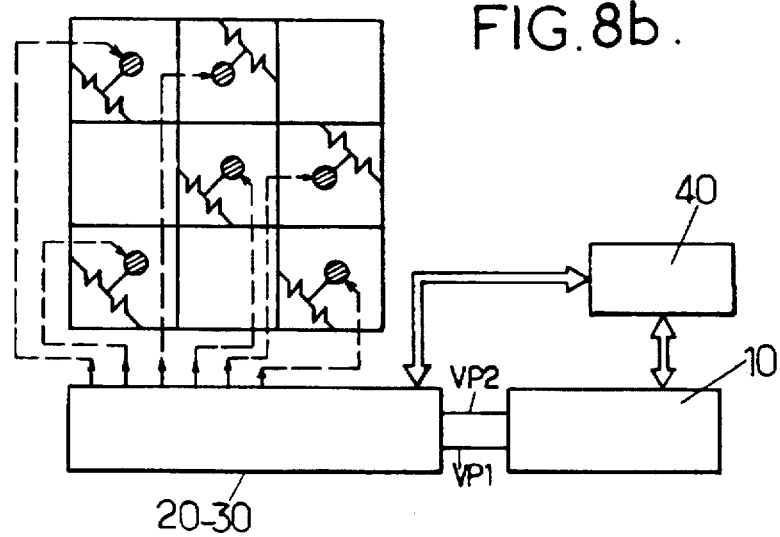
FIG. 8b represents a particular advantageous embodiment of a device allowing the implementation of a programmed configuration, either by addressing, or by the method of equipotential sets and subsets, more especially intended to be used in the case of a programmable connection matrix embodied according to FIGS. 6c and 6d in integrated circuit form.

When the configurable connection matrix, which is the subject of the present invention, is embodied in integrated circuit form, it may then be advantageous, when the electrically configurable connections in the on or off state are formed by two cascaded fusible elements joined to a terminal at their midpoint, to make the circuits for selective interconnection 20 and for applying the programming voltages 30 as a single element, denoted 20–30 in FIG. 8b, so as to simplify the implementation. In such a case, it is indicated that these two circuits can advantageously be formed by a shift register with N(N−1)/2 programmable outputs. This shift register can then be installed directly in the connection matrix, laterally thereto.

In this case, each output can then be interconnected to the terminal $B_i$ for applying the programming potential represented earlier in FIG. 6c.

It goes without saying that the link between the circuit 20–30, that is to say the outputs of the relevant shift register, and the terminals Bi can be embodied by means of specific conductive lines. The set of lines of the first network is linked to one of the potentials $VP_1$ or $VP_2$ during programming.

In such a case, each output of the shift register is then programmed as a function of the address of each stud Bi so as to deliver one or the other of the programming voltages and thus to carry out configuration by programming, as described earlier in the description by subdivision into a first and a second starting set and successive repetition over the corresponding subsets, or else, in the more specific case of integrated circuits, by programming per successive address as described in connection with FIG. 6c and FIG. 6d.

Naturally it will be understood that the solution consisting in using a shift register is particularly advantageous insofar as the latter is energized only during the programming phase.

I claim:

1. An electrically configurable connection matrix between lines of at least one input/output port with N pins, comprising:

a dielectric support, a first plurality of N distinct electrical lines on said support, forming a first network, each electrical line of said first network being connected to a pin of said input/output port, and a second plurality of N distinct electrical lines on said support forming a second network, distinct form the first network, each electrical line of rank k, k ∈ {0, N−1} of said first network being electrically connected by a permanent electrical connection to the electrical line of same rank k of said second network, and each electrical line of rank q≠k of said first network being electrically connected by a configurable on/off electrical connection to said electrical line of rank k of said second network, said electrical lines of said first and second networks being formed on the same face of said support, the electrical lines of said first and second networks being separated by a layer of electrically insulating material, said permanent electrical connections being formed by through-holes furnished with a metallization and the configurable electrical connections being formed by fusible electrical links for which switching to an off state is obtained by energizing the links with a current of a strength greater than a specified threshold value, said electrical lines of the first network being substantially parallel to one another, the electrical lines of the second network being substantially parallel to one another, and the electrical lines of said first network being substantially transverse to the electrical lines of said second network, each line of said first and of said second network being labeled by its rank k, k+r even or odd with k ∈ {0, N−1} and r≠0 ∈ {1−N, N−1}, electrical interconnections between two adjacent or non-adjacent lines of rank k and k+r of said first network being obtained for a logic relation:

$A_{k}A_{k+r}$ if $T_{k,k}$ AND $T_{k+r,k}$ OR $T_{k,k+r}$ AND $T_{k+r, k+r}$ in which:

$A_{k}A_{k+r}$ denotes the true logic value of interconnections of the lines A of ranks k and k+r, respectively, of said first network, and the first index and the second index respectively denoting the ranks of the lines of said first and second networks, $T_{k,k}$ and $T_{k+r,k+r}$ denotes the true logic value of permanent electrical connections with addresses k, k and k+r, k+r respectively, between electrical lines of the same rank of said first and second networks, and $T_{k,k+r}$ and $T_{k+r,k}$ denotes the true logic value of the on state of the configurable electrical connections with corresponding addresses k, k+r and k+r, k between electrical lines of said first and second networks, all the other configurable electrical connections connected to interconnected electrical lines of rank k, k+r of said first network being at the complemented logic value of the off state, for an interconnection of said only lines of rank k, k+r of said first network, thereby providing, through control the states of a plurality of said configurable electrical connections, an electrical link between two adjacent or non-adjacent electrical lines of said first network, with any other adjacent or non-adjacent lines of rank different from rank k and k+r being disconnected after said electrical link is provided.

2. The connection matrix of claim 1, wherein said electrical lines are formed by substantially rectilinear strip conductors, the electrical lines of even rank k=2j of said first network being linked at one of their ends to a first input/output port and the electrical lines of odd rank k=2j+1 of said first network being linked at the other of their ends to a second input/output port.

3. The connection matrix of claim 1, wherein said electrical lines are formed by substantially rectilinear strip conductors, said electrical lines being subdivided into groups of interconnected or non-interconnected lines, the lines of each group being connected to a distinct input/output port.

4. The connection matrix of claim 3, wherein said strip conductors are formed on a dielectric support selected from the group consisting a printed circuit board, a ceramic substrate and a silicon support.

5. The connection matrix of claim 1, wherein said electrical links are formed by one of (i) an electric fuse and (ii) two diodes mounted head to tail.

6. An electrically configurable connection matrix between lines of at least one input/output port with N pins, comprising:

a dielectric support, a first plurality of N distinct electrical lines on said support, forming a first network, each electrical line of said first network being connected to a pin of said input/output port, and a second plurality of N distinct electrical lines on said support forming a second network, distinct from the first network, each electrical line of rank k, k ∈ {0, N−1} of said first network being electrically connected by a permanent electrical connection to the electrical line of same rank k of said second network, and each electrical line of rank q≠k of said first network being electrically connected by a configurable on/off electrical connection to said electrical line of rank k of said second network, said electrical lines of said first network being formed on a first face of said support and the electrical lines of said second network being formed on a second face of said support, said permanent electrical connections being formed by through-holes furnished with a metallization and said configurable electrical connections being formed by fusible electrical links for which switching to an off state is obtained by energizing the links with a current of a strength greater than specified threshold value, said electrical lines of the first network being substantially parallel to one another, the electrical lines of the second network being substantially parallel to one another, and the electrical lines of said first network being substantially transverse to the electrical lines of said second network, each line of said first and second networks being labeled by its rank k, k+r even or add, with k ∈ {0, N−1} and r≠0∈ {1−N, N−1}, electrical interconnections between two adjacent or non-adjacent lines of rank k and k+r of said first network being obtained for a logic relation:

$A_k + A_{k+r}$ if $T_{k,k}$ AND $T_{k+r,k}$ OR $T_{k,k+r}$ AND $T_{k+r,k+r}$ in which:

$A_k + A_{k+r}$ denotes the true logic value of interconnections of the lines A of ranks k and k+r, respectively, of said first network, and the first index and the second index respectively denoting the ranks of the lines of said first and second networks, $T_{k,k}$ and $T_{k+r,k+r}$ denotes the true logic of permanent electrical connections with addresses k, k and k+r; k+r respectively, between electrical lines of same rank of said first and second networks, and $T_{k,k+r}$ and $T_{k+r,k}$ denotes the true logic value of the on state of the configurable electrical connections with corresponding addresses k, k+r and k+r, k between electrical lines of said first and second networks, all the other configurable electrical connections connected to interconnected electrical lines of rank k, k+r of said first network being at the complemented logic value of the off state, for an interconnection of said only lines of rank k, k+r of said first network, thereby providing, through control of the states of a plurality of said configurable electrical connections, an electrical link between two adjacent or non-adjacent electrical lines of said first network, with any other adjacent or non-adjacent lines of rank different from rank k and k+r being disconnected after said electrical link is provided.

7. The connection matrix of claim 6, wherein said electrical links are formed by one of (i) an electric fuse and (ii) two diodes mounted head to tail.

8. An electrically configurable connection matrix between lines of at least one input/output port with N pins, wherein N is an integer at least equal to 3, said matrix comprising:

a dielectric support;

a first plurality of N distinct electrical lines on said support, said electrical lines forming a first network, each electrical line of said first network being connected to a pin of said input/output port; and a second plurality of N distinct electrical lines on said support forming a second network, distinct from said first network, said electrical lines of said first and second network being connected such that:

each electrical line of rank k, k ∈ {0, N−1} of said first network is electrically connected by a permanent electrical connection to the electrical line of same rank k of said second network, said matrix comprising a set of permanent electrical connections forming a diagonal, said first and second networks of distinct electrical lines extending on both sides of the diagonal formed by the set of permanent electrical connections;

each electrical line of rank q≠k belonging to said first network is electrically connected by a configurable electrical connection to the line of rank k belonging to said second network when the electrical line of rank q≠k belonging to said second network is not electrically connected by a configurable electrical connection to the line of rank k belonging to said first network, and vice versa, wherein the number of configurable electrical connections is equal to $N_c$=N(N−1)/2, and wherein the establishment of an electrical link between any two adjacent or non-adjacent electrical lines of said first network is thereby enabled; and wherein a plurality of said configurable electrical connections are located on each side of said diagonal formed by said permanent electrical connections such that said electrically configurable connection matrix has a configuration which is asymmetric with respect to said diagonal, thereby providing increased spacing in the layout of the configurable electrical connections so as to reduce the heating of the connection matrix.

9. An electrically configurable connection matrix according to claim 8, wherein an equal number of configurable electrical connections are located on each side of said diagonal formed by said permanent electrical connections.

10. An electrically configurable connection matrix according to claim 9, wherein the configurable electrical connection connecting each said electrical line of rank q to each said electrical line of rank k is located on one side of said diagonal formed by said permanent electrical connections when q+k is an even number, and the configurable electrical connection connecting each said electrical line of rank q to each said electrical line of rank k is located on the other side of said diagonal when q+k is an odd number, thereby providing optimization of the spacing of the layout of the configurable electrical connections so as to locally minimize the heating of the connection matrix.

11. The connection matrix of claim 9, said configurable electrical connections comprise connections selected from the group consisting of fuses, conductive inks, and head-to-tail mounted diodes.

12. The connection matrix of claim 11, said connection matrix being embodied in the form of an integrated circuit, wherein said configurable electrical connections are formed by:

first and second fusible elements interconnected in series through a midpoint between electrical lines of the first and second networks, and a signal terminal for applying a signal for programming the configuration of the electrical connection, said signal terminal being electrically linked to said midpoint of the first and second fusible elements.

13. The connection matrix according to claim 12, wherein said signal terminal is linked to said midpoint by way of a diode.

14. A method for programmed configuration of a configurable connection matrix, said connection matrix comprising a dielectric support and a first plurality of N distinct electrical lines forming a first network, each electrical line of said first network being connected to a pin of at least one input/output port with N pins together with a second plurality of N distinct electrical lines forming a second network, distinct form the first network, each electrical line of rank k, k ∈ {0, N−1} of said first network being electrically connected by a permanent electrical connection to the electrical line of same rank k of said second network and each electrical line of rank q≠k of said first network being electrically connected by a configurable electrical connection having on and off states to said electrical line of rank k of said second network so as to provide, through control of the states of plurality of said configurable electrical connections, an electrical link between two adjacent or non-adjacent electrical lines of said first network, wherein, for a matrix containing N×N electrical lines constituting said first and second networks, said method comprises the steps of:

a) applying to a first starting set of electrical lines containing Q electrical lines of said first network, a first programming electrical potential of a specified value;

b) applying to a second starting set of electrical lines containing P electrical lines of said first network, a second programming electrical potential of a different specified value, so as to (i) maintain in the initial on state every configurable electrical connection with address k in said second network which makes electrical connection between two electrical lines of said first starting set, and to (ii) place in the off state every configurable electrical connection with address k in said second network which makes electrical connection between electrical lines of said first and second starting sets; and c) repeating steps a) and b) on successive subsets of said first and second starting sets so as to obtain a final configuration.

15. The method of claim 14, wherein, for an optimized number of configurable electrical connections $N_c=N(N-1)/2$, the number of configurable electrical connections contained in the first starting set being equal to $N_{cg}=Q(Q-1)/2$, the number of configurable electrical connections contained in the second starting set being equal to $N_{cf}=P(P-1)/2$ and the number of configurable electrical connections ensuring the link between the electrical lines of the first and of the second starting set being equal to $N_{cgf}=Q(N-Q)$, said method comprising the further steps of:

d) choosing as said first starting set the set of electrical lines of said first network containing a minimum of electrical lines; and e) choosing as said second starting set a set complementary to said first starting set, over a set formed by the totality of the electrical lines of said first network, to thereby obtain optimization of the number of configurable electrical connections subjected to the configuration operation.

16. A device for programmed configuration of a connection matrix, said connection matrix comprising a dielectric support and a first plurality of N distinct electrical lines forming a first network, each electrical line of said first network being connected to a pin of at least one input/output port with N pins together with a second plurality of N distinct electrical lines forming a second network, distinct from the first network, each electrical line of rank k, k ∈ {0, N−1} of said first network being electrically connected by a permanent electrical connection to the electrical line of same rank k of said second network and each electrical line of rank q≠k of said first network being electrically connected by a configurable electrical connection having on and off states to said electrical line of rank k of said second network so as to provide, through control of the states of a plurality of said configurable electrical connections, an electrical link between two adjacent or non-adjacent electrical lines of said first network, said device including:

means for generating at least two distinct programming potentials;

first interconnecting means for selectively interconnecting the electrical lines of said first network of said connection matrix to form a first starting set of electrical lines, and second interconnecting means for selectively interconnecting the electrical lines of said first network of said connection matrix to form a second starting set of electrical lines, said first and second starting sets each comprising electrical lines electrically connected together, the electrical lines of said first starting set being electrically insulated from the electrical lines of said second starting set; and applying means for applying said distinct programming potentials to the electrical lines of said first and second starting sets.

17. The device of claim 16, wherein for a connection matrix in which the configurable electrical connections are formed by two cascaded fusible elements joined to a terminal at their midpoint, said interconnecting means and said applying means comprise a shift register with $N(N-1)/2$ programmable outputs, each output being interconnected to said terminal for applying a programming potential thereto, and each output of the shift register being programmed to produce one or the other of the programming potentials.

* * * * *